(12) United States Patent
Watarai

(10) Patent No.: US 6,316,964 B1
(45) Date of Patent: Nov. 13, 2001

(54) METHOD FOR GENERATING DIFFERENTIAL TRI-STATES AND DIFFERENTIAL TRI-STATE CIRCUIT

(75) Inventor: Seiichi Watarai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/455,509

(22) Filed: Dec. 6, 1999

(30) Foreign Application Priority Data

Dec. 8, 1998 (JP) ................................................ 10-349204

(51) Int. Cl.[7] ........................ H03K 19/094; H03K 19/003
(52) U.S. Cl. .............................................. 326/115; 326/27
(58) Field of Search ........................... 326/56–58, 82–83, 326/89, 112, 115, 26–27

(56) References Cited

U.S. PATENT DOCUMENTS

| | | | | |
|---|---|---|---|---|
| 5,285,477 | * | 2/1994 | Leonowich | 375/257 |
| 5,418,478 | * | 5/1995 | Van Brunt et al. | 326/86 |
| 5,448,311 | * | 9/1995 | White et al. | 348/707 |
| 5,466,325 | | 11/1995 | Mizuno et al. | 156/344 |
| 5,986,473 | * | 11/1999 | Krishnamurthy et al. | 326/83 |
| 6,051,990 | * | 4/2000 | Uber | 326/33 |

FOREIGN PATENT DOCUMENTS

| | | |
|---|---|---|
| 0 547 814 A2 | 12/1992 | (EP) . |
| 2 295 643 | 7/1976 | (FR) . |
| 405037261A | * 2/1993 | (JP) ................................. 330/253 |

* cited by examiner

Primary Examiner—Michael Tokar
Assistant Examiner—James H Cho
(74) Attorney, Agent, or Firm—McGuireWoods LLP

(57) ABSTRACT

A differential tri-state circuit in which noise picked up by an output signal can be removed. The differential tri-state circuit is so configured that, by allowing the same currents to flow from a current source to a p-channel MOS FET and an n-channel MOS FET and to other p-channel MOS FET and other n-channel MOS FET, high impedance state exists between output terminals. With the p-channel MOS FET and the n-channel MOS FET being brought into conduction and with other p-channel MOS FET and other n-channel MOS FET being brought out of conduction, by causing terminating resistors RT1 and RT2 to be conducting or by bringing about a state being in reverse to the above, a 0 state or 1 state is outputted between output terminals.

23 Claims, 9 Drawing Sheets

METHOD FOR GENERATING DIFFERENTIAL TRI-STATES AND DIFFERENTIAL TRI-STATE CIRCUIT

BACKGROUND OF THE INVENTION

1. Field of the Invention

The present invention relates to a method for generating differential tri-states and a differential tri-state circuit being able to output three states including a first signal state, a second signal state and a high impedance state.

2. Description of the Related Art

To transmit a logic signal between integrated circuits by using two signals each having a small-amplitude to be transmitted through transmission paths such as two bus lines in communication systems, computers and the like, two methods, one being a single-phase transmission system and the other being a differential-phase transmission system, are available. In the single-phase transmission system, one small-amplitude signal for transmission use is transmitted through two bus lines. In the differential-phase transmission system, two signals are used, i.e., a small-amplitude signal, which is equivalent to the signal used in the single-phase transmission system, is transmitted through one line of the two bus lines and a small-amplitude signal being in reverse phase is simultaneously transmitted through the other line of the two bus lines.

Operations of the differential-phase transmission system are described below. In the differential-phase transmission system, to transmit a logic signal between integrated circuits by using two signals to be transmitted through two bus lines, an output circuit to send out a logic signal to these transmission paths is used. If one signal being transmitted through one of two transmission paths is at a high level, it is defined as a logical 1 and the other signal being transmitted through the other of the two transmission paths is at a low level, it is defined as a logical 0 (zero). That is, a logic signal (hereinafter referred to as a "transmission signal") to be transmitted by the output circuit is composed of two signals to be transmitted through the two transmission paths. Moreover, when the output circuit is outputting the logical 1 or 0, it is hereinafter defined that "the output circuit is outputting the 1 state or 0 state".

Conventionally, an amplitude of a voltage between a high level signal and a low level signal is near to that of a supply power voltage applied to integrated circuits in most cases. However, in recent years, the amplitude of the voltage applied between the high level signal and the low level signal is made small for transmission purpose. For example, in an output circuit using conventional CMOS interface specifications, an amplitude of the transmission signal is approximately equal to a supply power voltage, i.e., about 5 volts or about 3 volts, in general. On the other hand, in an output circuit using LVDS (Low Voltage Differential Signaling) interface specifications, an amplitude of the transmission signal is as extremely small as about 0.3 volts.

The reasons for making an amplitude of the transmission signal so small are that such a small-amplitude signal is greatly effective in high speed transmission, low power consumption and reduction of noise occurring during the signal transmission. Therefore, in an integrated circuit seeking high speed transmission and low power consumption, it is necessary to use a small-amplitude interfacing output circuit to send out a signal having a small-amplitude. In such a small-amplitude interfacing output circuit, a transmission signal having a small-amplitude voltage being less than the power supply voltage is employed to achieve the high speed transmission, low power consumption and reduction of noise. Known small-amplitude interfacing output circuits include, in addition to the LVDS circuit described above, GRL (Gunng Transceiver Logic), CTT (Center Tapped Termination), PECL (Psuedo Emirter Coupled Logic) circuits.

For example, in the case of the PECL circuit, though its power supply voltage is about 3 volts or 5 volts, an amplitude of a transmission signal to be employed is about 0.6 volts. As a means to transfer such small-amplitude signals, a terminating voltage source and terminating resistors are used.

A conventional small-amplitude interfacing output circuit having the configurations described above is shown in FIG. 12. The small-amplitude interfacing output circuit contains a differential tri-state circuit 1T. Though the terminating voltage source VS and terminating resistors RT1 and Rt2 to be used in the small-amplitude interfacing output circuit are connected to transfer lines L1 and L2 as shown in FIG. 12, they may be mounted within the differential tri-state circuit as shown in FIG. 9. However, even if the terminating voltage source VS is mounted within the differential tri-state circuit, the terminating voltage is supplied through the transfer lines L1 and L2 to the outside.

The differential tri-state circuit 1T is connected to, for example, a CMOS internal circuit 52 of a first integrated circuit 50. The transfer lines L1 and L2 are connected to an input circuit 1R of a second integrated circuit 54 to receive a transmission signal. The input circuit 1R is connected to a CMOS internal circuit 56.

As shown in FIGS. 9 and 10, the differential tri-state circuit 1T is comprised of a current source 2, a current source 4, a switching circuit 1S in which a drain of a p-channel MOS FET P3 is connected to a drain of an n-channel MOS FET N3, a source of the p-channel MOS FET P3 is connected to a flow-out terminal NodeP of the current source 2, a source of an n-channel MOS FET N3 is connected to an inflow terminal NodeN of the current source 4, a drain of a p-channel MOS FET P4 is connected to a drain of an n-channel MOS FET N4, a source of the p-channel MOS FET P4 is connected to the flow-out NodeP of the current source 2 and a source of an n-channel MOS FET N4 is connected to the inflow terminal NodeN of the current source 4 and a switching voltage generating circuit 10 in which an output terminal 21 used to output a switching voltage signal APA is connected to a gate of the p-channel MOS FET P3, an output terminal 29 used to output a switching voltage signal APB is connected to a gate of the p-channel MOS FET P4, an output terminal 25 to output a switching voltage signal ANA is connected to a gate of the n-channel MOS FET N3 and an output terminal 31 to output a switching voltage signal ANB is connected to a gate of the n-channel MOS FET N4.

The p-channel MOS FETs P3 and P4 are composed of MOS FETs which have been produced under the same manufacturing conditions and have the same configurations. The n-channel MOS FETs N3 and N4 are composed of MOS FETs which have been produced under the same manufacturing conditions and have the same configurations.

The current source 2 is comprised of a p-channel MOS FET P1 a source of which is connected to a voltage source VDD having, for example, a predetermined voltage being 3 volts and a drain of which is connected to a current flow-out terminal NodeP, a p-channel MOS FET P2 a source of which is connected to the voltage source VDD, a gate of which is connected to a gate of the p-channel MOS FET P1 and the gate and a drain of which are connected to each other, and a current source 6 connected between the drain of the p-channel MOS FET P2 and a ground potential point.

The current source 4 is comprised of an n-channel MOS FET N1 a source of which is connected to a predetermined voltage value point, for example, a ground potential point and a drain of which is connected to a current flow-out terminal NodeN1, an n-channel MOS FET N2 a source of which is connected to a ground potential point, a gate of which is connected to a gate of the n-channel MOS FET N1 and the gate and a drain of which are connected to each other and a current source 8 connected between a drain of the n-channel MOS FET N2 and a voltage source VDD.

A switching voltage supply circuit 10 has a switching voltage generating portion 10S which is comprised of inverters 16 and 18 connected in series to an input terminal 12, a NAND circuit 20 one input of which is connected to an output of the inverter 18 and the other input of which is connected to an enable terminal 14, an inverter 22 an input of which is connected to the enable terminal 14, a NOR circuit one input of which is connected to the output of the inverter 18 and the other input of which is connected to an output of the inverter 22, a buffer 26 an input of which is connected to an output of the inverter 16, a NAND circuit 28 one input of which is connected to an output of the buffer and the other input of which is connected to the enable terminal 14 and a NOR circuit 30 one input of which is connected to an output of the buffer 26 and the other input of which is connected to an output of the inverter 22.

The switching voltage generating circuit 10 is so configured that a switching voltage signal APA is outputted from an output terminal 21 of the NAND circuit 20, a switching voltage signal ANA is outputted from an output terminal 25 of the NOR circuit 24, a switching voltage signal APB is outputted from an output terminal 29 of the NAND circuit 28 and a switching voltage signal ANB is outputted from an output terminal 31 of the NOR circuit 30.

A connection point between the drain of the p-channel MOS FET P3 and the drain of the n-channel MOS FET N3 is one output terminal OUTA of the differential tri-state circuit 1T and a connection point between the drain of the p-channel MOS FET P4 and the drain of the n-channel MOS FET N4 is the other output terminal OUTB of the same. For example, in a small-amplitude interfacing output circuit using the PECL specifications, the small-amplitude interfacing output circuit 1T as shown in FIG. 9 is employed in which terminating resistors RT1 and RT2 are connected in series between the output terminals OUTA and OUTB and a terminating supply voltage source VS is connected to a connection point between the terminating resistors RT1 and RT2.

Operations of the conventional differential tri-state circuit having the configurations described above are described below by referring to FIGS. 9, 10 and 11.

In a state where a low-level input signal IN is fed to an input terminal 12 of the switching voltage generating circuit 10 and the enable signal EN is fed to the enable terminal 14 (see the signal EN in FIG. 11), the switching voltage signals APA and APB are at a voltage level to put the differential tri-state circuit 1T in its disabled state, i.e., at a high level, while the switching voltage signals ANA and ANB are at a voltage to put the differential tri-state circuit 1T in its disabled state, i.e., at a low level.

When the high-level switching voltage signal APA is fed to the gate of the p-channel MOS FET P3, the high-level switching voltage APB is fed to the gate of the p-channel MOS FET P4, the low-level switching signal ANA is fed to the gate of the n-channel MOS FET N3 and the low-level switching voltage signal ANB is fed to the gate of the n-channel MOS FET N4, all these transistors are brought out of conduction, i.e., they are all turned OFF and no currents flow through any path from the current source 2 toward the current source 4, causing one output terminal OUTA and the other output terminal OUTB of the differential tri-state circuit to be at a voltage VTT of the terminating supply voltage source VS and to be put in a high impedance state (see a period ① of the signals OUTA and OUTB in FIG. 11). A voltage of the NodeP becomes VDD and the voltage of the NodeN is at a ground potential.

While the input signal IN remains at a low level (during the period i ② of the signal IN in FIG. 11), if the differential tri-state circuit is switched from its disabled state to its enabled state, for example, if a high-level enable signal EN is inputted, a level of the switching voltage signal APB generated from the switching voltage generating circuit 10 becomes low and a level of the switching voltage signal ANA becomes high. At this point, the switching voltage signal APA remains at a high level and the switching voltage signal ANB remains at a low level. Since the high-level switching voltage signal APA and the low-level switching voltage signal ANB are fed respectively to each of the gates of the p-channel MOS FET P3 and the n-channel MOS FET N4, these transistors remain OFF, while, since the switching voltage signal APB a level of which has become low is fed to the gate of the p-channel MOS FET and the switching voltage signal ANA a level of which has become high is fed to the gate of the n-channel MOS FET, these transistors P4 and N3 are turned ON. Accordingly, the current I flows from the current source 2 through the p-channel MOS FET which has been,turned ON, terminating resistors RT2 and RT1 and n-channel MOS FET N3 to the current source 4. That is, a signal which is at a high level at the output terminal OUTB and at a low at the OUTA is generated between the terminating resistors RT2 and RT1. Either of these two voltage levels is defined as a 1 state or 0 state. By making low a level of the switching voltage signal APA of the switching voltage generating circuit 10, making high a level of the switching voltage signal ANB, and by causing the switching voltage signal APB to remain at a high level and the switching voltage signal ANA to remain at a low level, the current I flows from the current source 2 through the p-channel MOS FET P3 which has been turned ON, terminating resistors RT2 and RT1 and the n-channel MOS FET N4 to the current source 4. That is, a signal which is at a high level at the output terminal OUTA and at a low at the OUTB is generated between the terminating resistors RT2 and RT1. Either of these two voltage levels is defined as a 1 state or 0 state.

However, during the period ② of the signal output in FIG. 11, since the current I flows after a transition of the enable signal EN to a high level, a transition of a voltage at the NodeP to lower voltage by Δ volt, for example, by one volt, takes place as shown in the signal NodeP in FIG. 11. The voltage transition causes a transient drop in the gate voltage VGP of the transistor P1 due to the addition of parasitic capacity CP between the drain and gate of the p-channel MOS FET P1 (see the signal VGP in FIG. 11). At the same time, a transition of a voltage at the flow-out terminal NodeN by Δ volt, for example, by one volt, takes place as shown in the signal NodeN in FIG. 11. The voltage transition causes a transient rise in the gate voltage VGN of the transistor P1 due to the addition of parasitic capacity CN between the drain and gate of the n-channel MOS FET N1 (see the signal VGN in FIG. 11).

The great transient flow of the current I causes a swing in voltages occurring at the output terminal OUTB toward a positive direction (see the signal OUTB in FIG. 11) as well as a swing in voltages occurring simultaneously at the output terminal OUTA toward a negative direction (see the signal OUTA in FIG. 11). As a result, a transient increase is produced in an amplitude of the output signal occurring between the output terminals OUTA and OUTB, which causes not only a departure from amplitude specifications but transient noise and malfunctions.

SUMMARY OF THE INVENTION

In view of the above, it is a first object of the present invention to provide a method for generating differential tri-states and a differential tri-state circuit wherein, with a current supplied to a switching circuit used to produce three output states, by causing high impedance state to exist between output terminals of the switching circuit and by switching the current that had flown within the switching circuit, a first signal state or a second signal state is outputted between the output terminals. It is a second object of the present invention to provide a method for generating differential tri-states and a differential tri-state circuit wherein, with a current not supplied to a switching circuit used to produce three output states, by causing a current that is to be supplied to the switching circuit to bypass the switching circuit and high impedance state to exist between output terminals of the switching circuit and, while the high impedance state exists, by allowing the current that had bypassed the switching circuit to flow through the switching circuit, a first signal state or a second signal state is outputted between the output terminals. It is a third object of the present invention to provide a differential tri-state circuit which is able to output a signal being free from noise that may occur when a state is switched from its high impedance state to the first signal state or the second signal state.

According to a first aspect of the present invention, there is provided a method for generating tri-states comprising the steps of:

utilizing a connection point between first and second transistors connected in series to each other as a first output terminal and a connection point between third and fourth transistors connected in series to each other as a second output terminal wherein the first connection point is connected through resistors to the second connection point and the first and second transistors are connected in parallel to the third and fourth transistors;

allowing a first signal state corresponding to a signal level representing one of two values for a binary signal to be outputted from the first and second output terminals by bringing about a state where the first and fourth transistors are turned ON and a state where the second and third transistors are turned OFF in response to a signal level representing one of two values for a binary signal to be inputted and an enable signal;

allowing a second signal state corresponding to a signal level representing the other of two values for a binary signal to be outputted from the first and second output terminals by bringing about a state where the second and third transistors are turned ON and a state where the first and fourth transistors are turned OFF in response to a signal level representing one of two values for the binary signal to be inputted and an enable signal;

setting a resistance value of each of the first to fourth transistors existing when the first to fourth transistors are simultaneously turned ON, a value of a current to be supplied to the first and second transistors and a value of a current to be supplied to the third and fourth transistors, to a value which causes the first and second output terminal to be at the same potential when the first to fourth transistors are simultaneously turned ON; and causing a high impedance state to exist between the first and second output terminals by turning the first to fourth transistors ON in response to a disable signal.

In the foregoing, a preferable mode is one wherein the method contains the further steps of:

connecting a source of the first transistor to a drain of the second transistor in series and connecting a source of the third transistor to a drain of the fourth transistor in series;

setting a resistance value of each of the first to fourth transistors existing when the first to fourth transistors are simultaneously turned ON, a value of a current to be supplied to the first and second transistor and a value of a current to be supplied to the third and fourth transistors, to a value which causes the first and second output terminal to be at the same potential when the first to fourth transistors are simultaneously turned ON; and causing a high impedance state to exist between the first and second output terminals by turning the first to fourth transistors ON in response to a disable signal.

According to a second aspect of the present invention, there is provided a method for generating tri-states comprising the steps of:

utilizing a connection point between first and second transistors connected in series to each other as a first output terminal and a connection point between third and fourth transistors connected in series to each other as a second output terminal wherein the first connection point is connected through resistors to the second connection point and the first and second transistors are connected in parallel to the third and fourth transistors;

bringing about a state where the first and fourth transistors are turned ON and a state where the second and third transistors are turned OFF in response to a signal level representing one of two values for a binary signal to be inputted and an enable signal, and a state where the second and third transistors are turned ON and a state where the first and fourth transistors are turned OFF in response to a signal level representing the other of two values for the binary signal to be inputted and an enable signal;

outputting, in response to an enable signal, first and second signal states corresponding to a signal level representing the binary signal from the and second output terminals by turning OFF transistors connected between one connection point between the first and second transistors connected in series to each other and the other connection point between the third and fourth transistors connected in series to each other, wherein said first and second transistors are connected in parallel to the third and fourth transistors; and causing a high impedance state to exist between the first and second output terminals by turning the first to fourth transistors ON in response to a disable signal and, at the same time, allowing a current to flow between the connection points by turning ON the transistors.

In the foregoing, a preferable mode is one wherein the method contains the further steps of:

connecting a source of the first transistor to a drain of the second transistor in series and connecting a source of the third transistor to a drain of the fourth transistor in series;

allowing a current flowing when the first and third transistors are turned ON, when the third and fourth transistors are turned OFF, when the first and third transistors are turned OFF and the third and fourth transistors are turned ON to flow from one connection point to the other connection point by turning ON, in response to a disable signal, transistors existing between one connection point connecting the first and second transistors connected in series to each other to the third and fourth transistors connected in series to each other, wherein the first and second transistors are connected in parallel to the third and fourth transistors; and causing a high impedance state to exist between the first and second output terminals by simultaneously turning the first to fourth transistors ON in response to a disable signal.

According to a third aspect of the present invention, there is provided a differential tri-state circuit having a switching circuit utilizing a connection point between first and second transistors connected in series to each other as a first output terminal and a connection point between third and fourth transistors connected in series to each other as a second output terminal wherein the first connection point is connected through resistors to the second connection point and wherein said first and second transistor and second transistors are connected in parallel to the third and fourth transistors;

comprising:

a first input terminal to which the binary signal is inputted;

a second input terminal to which enable and disable signals are inputted;

a switching voltage generating circuit connected to the first and second input terminals, used to generate a first switching voltage signal group to turn ON the first and fourth transistors and to turn OFF said second and third transistors in response to a signal level representing one of two values for the binary signal and an enable signal, a second switching voltage signal group to turn to turn ON the second and third transistors and to turn OFF the first and fourth transistors in response to a signal level representing the other of two values for the binary signal and a third switching voltage signal group to simultaneously turn ON the first to fourth transistors in response to a disable signal;

whereby a resistance value of each of the first to fourth transistors existing when the first to fourth transistors are simultaneously turned ON, a value of a current to be supplied to the first and second transistor and a value of a current to be supplied to the third and fourth transistors are set to a value which causes the first and second output terminal to be at the same potential when the first to fourth transistors are simultaneously turned ON and wherein a first signal state corresponding to a signal level representing one of two values for the binary signal is outputted when the first switching voltage signal group is generated, a second signal state corresponding to a signal level representing the other of two values for said binary signal is outputted when the second switching voltage signal group is generated, and a high impedance state is outputted when the third switching voltage signal group is generated.

In the foregoing, a preferable mode is one wherein the four transistors are unipolar transistors.

Also, a preferable mode is one wherein a source of the first transistor is connected in series to a drain of the second transistor and a source of the third transistor is connected in series to a drain of the fourth transistor.

Also, a preferable mode is one wherein the first and third transistors are composed of p-channel transistors having the same configurations and the second and fourth transistors are composed of n-channel transistors having the same configurations.

Also, a preferable mode is one wherein a first constant current source is connected to one connection point connecting, in parallel, the first p-channel transistor and second n-channel transistor connected in series to each other to the third p-channel transistor and fourth n-channel transistor connected in series to each other, and a second constant current source is connected to the other connection point connecting, in parallel, the first p-channel transistor and the second n-channel transistor connected in series to each other to the third p-channel transistor and the fourth n-channel transistor connected in series to each other.

Also, a preferable mode is one wherein a first terminating resistor is connected in series to a second terminating resistor and a terminating power supply source is connected to a connection point between these terminating resistors.

Also, a preferable mode is one wherein the switching voltage generating circuit is comprised of a NOR circuit to output a first switching voltage signal to a gate of the first unipolar transistor when an input signal and an inverted enable signal are inputted, a NAND circuit to output a second switching voltage signal to a gate of the second unipolar transistor when an input signal and an enable signal are inputted, a NOR circuit to output a third switching voltage signal to a gate of the third unipolar transistor when an inverted input signal and an inverted enable signal are inputted and a NAND circuit to output a fourth switching voltage signal to a gate of the fourth unipolar transistor.

According to a fourth aspect of the present invention, there is provided a differential tri-state circuit comprising:

a switching circuit wherein one connection point between the first and second transistors connected in series to each other and the other connection point between the third and fourth transistors connected in series to each other, with resistors inserted between the two connection points, are used as output terminals, a first input terminal to which the binary signal is inputted;

a second input terminal to which binary-format enable and disable signals are inputted;

a switching voltage generating circuit connected to the first and second input terminals, used to generate a first switching voltage signal group to turn ON the first and fourth transistors and to turn OFF the second and third transistors in response to a signal level representing one of two values for the binary signal and an enable signal, a second switching voltage signal group to turn to turn ON the second and third transistors and to turn OFF the first and fourth transistors in response to a signal level representing the other of two values for the binary signal and a third switching voltage signal group to simultaneously turn ON the first to fourth transistors in response to a disable signal;

whereby a resistance value of each of the first to fourth transistors existing when the first to fourth transistors are simultaneously turned ON, a value of a current to be supplied to the first and second transistor and a value of a current to be supplied to the third and fourth transistors are set to a value which causes the first and second output terminal to be at the same potential when the first to fourth transistors are simultaneously turned ON and wherein a first signal state corresponding to a signal level representing one of two values for the binary signal is outputted when the first switching voltage signal group is generated, a second signal state corresponding to a signal level representing the other of tow values for the binary signal is outputted when the second switching voltage signal group is generated, and a high impedance state is outputted when the third switching voltage signal group is generated.

In the foregoing, it is preferable that the four transistors are unipolar transistors.

Also, it is preferable that a source of the first transistor is connected in series to a drain of the second transistor and a source of the third transistor is connected in series to a drain of the fourth transistor.

Also, it is preferable that the first and third transistors are composed of p-channel transistors having the same configurations and the second and fourth transistors are composed of n-channel transistors having the same configurations.

Also, it is preferable that a first constant current source is connected to the first p-channel transistor, a second constant current source is connected to the second n-channel transistor, a third constant current source is connected to the third p-channel transistor and a fourth constant current source is connected to the fourth n-channel transistor.

Also, it is preferable that a first terminating resistor is connected in series to a second terminating resistor and a terminating power supply source is connected to a connection point between these terminating resistors.

Furthermore, it is preferable that the switching voltage generating circuit is comprised of a NOR circuit to output a first switching voltage signal to a gate of the first unipolar transistor when an input signal and an inverted enable signal are inputted, a NAND circuit to output a second switching voltage signal to a gate of the second unipolar transistor when an input signal and an enable signal are inputted, a NOR circuit to output a third switching voltage signal to a gate of the third unipolar transistor when an inverted input signal and an inverted enable signal are inputted and a NAND circuit to output a fourth switching voltage signal to a gate of the fourth unipolar transistor when an inverted input signal and an enable signal are inputted.

According to a fifth aspect of the present invention, there is provided a differential tri-state circuit comprising:

a switching circuit utilizing a connection point between first and second transistors connected in series to each other as a first output terminal and a connection point between third and fourth transistors connected in series to each other as a second output terminal wherein the first connection point is connected through resistors to the second connection point and the first and second transistors are connected in parallel to the third and fourth transistors;

transistor circuits connected between one connection point connecting, in parallel, the first transistor and second transistor connected in series to each other to the third transistor and the fourth transistor connected in series to each other and the other connection point;

a first input terminal to which the binary signal is inputted;

a second input terminal to which binary-format enable and disable signals are inputted;

a switching voltage generating circuit connected to the first and second input terminals, used to generate a first switching voltage signal group to turn ON the first and fourth transistors and to turn OFF the second and third transistors in response to a signal level representing one of two values for the binary signal and an enable signal, a second switching voltage signal group to turn to turn ON the second and third transistors and to turn OFF the first and fourth transistors in response to a signal level representing the other of two values for the binary signal and a third switching voltage signal group to simultaneously turn ON the first to fourth transistors in response to a disable signal;

whereby a first signal state corresponding to a signal level representing one of two values for the binary signal is outputted when the first switching voltage signal group is generated, a second signal state corresponding to a signal level representing the other of two values for the binary signal is outputted when the second switching voltage signal group is generated, and a high impedance state is outputted when the third switching voltage signal group is generated.

In the foregoing, a preferable mode is one wherein the four transistors are unipolar transistors.

Also, a preferable mode is one wherein a source of said first transistor is connected in series to a drain of the second transistor and a source of the third transistor is connected in series to a drain of the fourth transistor.

Also, a preferable mode is one wherein the first and third transistors are composed of p-channel transistors having the same configurations and the second and fourth transistors are composed of n-channel transistors having the same configurations.

Also, a preferable mode is one wherein a first constant current source is connected to one connection point connecting, in parallel, the first p-channel transistor and second n-channel transistor connected in series to each other to the third p-channel transistor and fourth n-channel transistor connected in series to each other, and a second constant current source is connected to the other connection point connecting, in parallel, the first p-channel transistor and the second n-channel transistor connected in series to each other to the third p-channel transistor and the fourth n-channel transistor connected in series to each other.

Also, a preferable mode is one wherein a first terminating resistor is connected in series to a second terminating resistor and a terminating power supply source is connected to a connection point between these terminating resistors.

Furthermore, a preferable mode is one wherein the switching voltage generating circuit is comprised of a NAND circuit to output a first switching voltage signal to a gate of the first unipolar transistor when an input signal and an enable signal are inputted, a NOR circuit to output a second switching voltage signal to a gate of the second unipolar transistor when an input signal and an inverted enable signal are inputted, a NAND circuit to output a third switching voltage signal to a gate of the third unipolar transistor when an inverted input signal and an enable signal are inputted and a NOR circuit to output a fourth switching voltage signal to a gate of the fourth unipolar transistor when an inverted input signal and an inverted enable signal.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
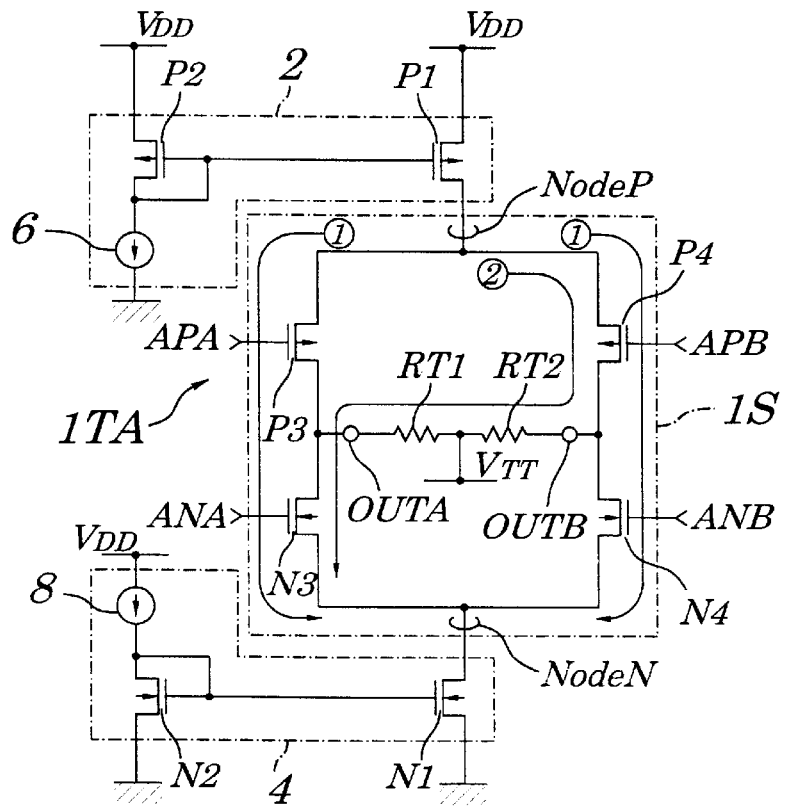
FIG. 1 is a schematic circuit diagram showing configurations of a differential tri-state circuit according to a first embodiment of the present invention.
Figure 2:
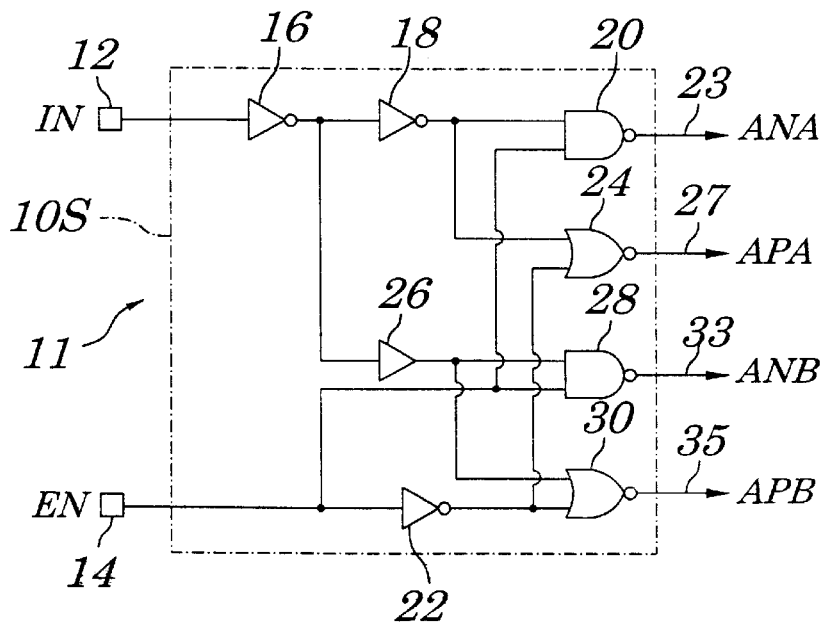
FIG. 2 is a schematic circuit diagram showing configurations of a switching voltage generating circuit of the differential tri-state circuit of the first embodiment.
Figure 3:
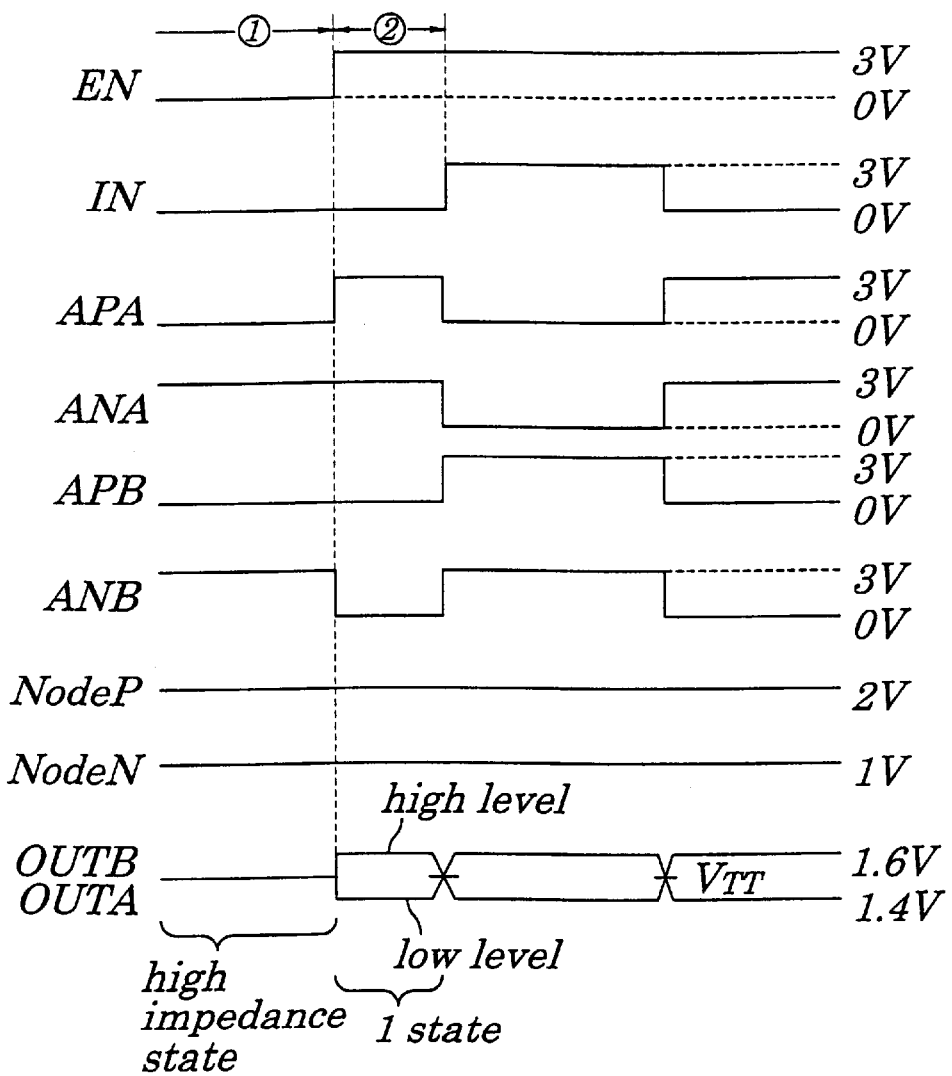
FIG. 3 is a timing chart showing operations of the differential tri-state circuit of the first embodiment of the present invention.

FIG. 1 is a schematic circuit diagram showing configurations of a differential tri-state circuit according to a first embodiment of the present invention. FIG. 2 is a schematic circuit diagram showing configurations of a switching voltage generating circuit of the differential tri-state circuit of the first embodiment. FIG. 3 is a timing chart showing operations of the differential tri-state circuit of the first embodiment.

Figure 9:
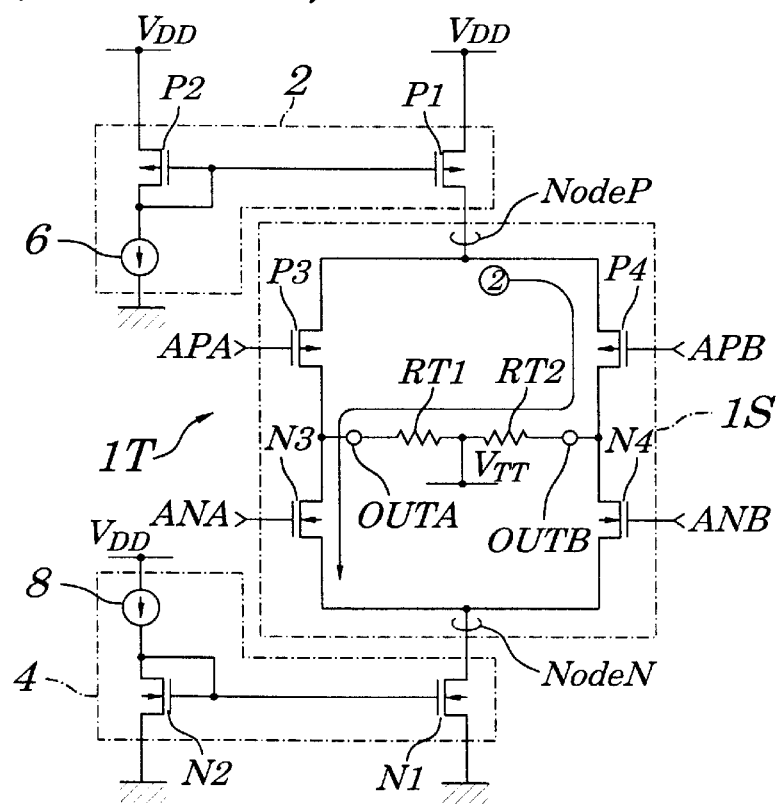
FIG. 9 is a schematic diagram showing a conventional differential tri-state circuit.

The differential tri-state circuit 1TA is so configured that, by turning any of switching transistors ON while the differential tri-state circuit 1TA is in its disabled state, fluctuations in voltages of an output terminal do not occur at the time of transition of the circuit 1TA from its disabled state to its enabled state and is comprised of a current source 2, a switching circuit 1S, a current source 4 and a switching voltage generating circuit 11. As shown in FIG. 2, the switching voltage generating circuit 11 is provided which is used to supply a switching voltage to the switching circuit 1S and which also constitutes the differential tri-state circuit. A switching voltage generating circuit section 10S constituting the switching voltage generating circuit 11 has the same configurations as the conventional circuit shown in FIG. 10 and is adapted to output a switching voltage signal ANA from an output terminal 23 of its NAND circuit 20, a switching voltage signal APA from an output terminal 27 of its OR circuit and a switching voltage signal ANB from an output terminal 33 of its NAND circuit and a switching voltage signal APB from an output terminal 35 of its NOR circuit. Except these components described above, the differential tri-state circuit of this embodiment has the same configurations as those shown in FIGS. 9 and 10. The same reference numbers in FIGS. 1 and 2 designate corresponding parts in FIGS. 9 and 10, the description of which is omitted accordingly.

Next, operations of the differential tri-state circuit of this embodiment are described hereafter by referring to FIGS. 1 to 3.

In a state where a low-level enable signal EN is fed to an enable terminal 14 of the switching voltage generating circuit 11 (i.e., during a period ① of the signal EN in FIG. 3), regardless of a voltage level of an input signal IN fed to an input terminal 12, the switching voltage signals APA and APB are at a voltage level causing the differential tri-state circuit 1TA to be in its disabled state (i.e., in a high impedance state), that is, at a low level (see signals APA and APB in FIG. 3) and the switching voltage signals ANA and ANB are at a voltage level causing the differential tri-state circuit 1TA to be its a disabled state, that is, at a high level (see signals ANA and ANB in FIG. 3).

Since the low-level switching voltage signal APA is fed to a gate of a p-channel MOS FET P3, the low-level switching voltage signal APB is fed to a gate of a p-channel MOS FET P4, the high-level switching voltage signal ANA is fed to a gate of an n-channel MOS FET N3 and a high-level switching voltage signal ANB is fed to a gate of an n-channel MOS FET N4, all of these transistors are put into a conducting state, i.e., they are turned ON, causing one half of a current I flowing from the current source 2 to be supplied to a p-channel MOS FET P3 and n-channel MOS FET N3 and die other half of the current I to be supplied to the p-channel MOS FET P4 and n-channel MOS FET N4, and each half current merges with the other to become the current I and flows into a current source 4. As a result, output terminals OUTA and OUTB are at the same potential (at a voltage Vtt of a terminating power supply source VS), causing the differential tri-state circuit to be in a high impedance state. At this point, since a current being equivalent to that which can keep the differential tri-state circuit in its enabled state is supplied by the constant current source 2, there is no fluctuation in the voltage of the Node P, while, since a current being equivalent to that which can keep the differential tri-state circuit in its enabled state is absorbed by the constant current source 4, there is no fluctuation in the voltage of the Node N as well.

After the differential tri-state circuit is switched from its disabled state to its enabled state, for example, after a high-level enable signal EN is inputted (i.e., after a state of the signal EN is changed from the period ① to ② in FIG. 3), if the input signal IN remains at a low level, the switching voltage signal APB generated from the switching voltage generating circuit 11 remains at a low level and the switching voltage signal ANA remains at a high level (see the signals APB and ANA in FIG. 3), while a level of the switching voltage signal APA becomes high (see the signal APA in FIG. 3) and a level of the switching voltage signal ANB becomes low (see the signal ANB in FIG. 3). Then, since the switching voltage signal APB which remains at a low level is applied to the gate of the p-channel MOS FET P4 and the switching voltage signal ANA which remains at a high level is applied to the gate of the n-channel MOS FET, these MOS FETs P4 and N3 still remain ON. On the other hand, since the switching voltage signal APA the level of which is changed to a high is applied to the gate of the p-channel MOS FET and the switching voltage signal ANB the level of which is changed to a low is applied to the gate of the n-channel MOS FET N4, these MOS FETs P3 and N4 are turned OFF. Accordingly, the current I flows, through the p-channel MOS FET P4 being in an ON state, terminating resistors RT2 and RT1 and the n-channel MOS FET N3 being also in an ON state, to the current source 4. That is, a signal being at a high level at the output terminal OUTB and being at a low level at the output terminal OUTA is produced between the terminating resistors RT 2 and RT1. The high-level or low-level voltage generated at either of these two terminals may be defined logically as a 1 state and a 0 state or vice versa. When the signals having these output voltages are produced at the output terminal OUTA and OUTB, since there is no fluctuation in the current I flowing from the NodeP and there is no fluctuation in the current I flowing into the NodeN, a voltage of the NodeP is 2 volts being at the same voltage which can keep the differential tri-state circuit in its disabled state and a voltage of the NodeN is 1 volt being at the same voltage which can keep the tri-state circuit in its disabled state.

Therefore, a voltage at the NodeP occurring while the differential tri-state circuit is in its disabled state is approximately the same as that at the NodeP occurring when the tri-state circuit is switched from its disabled state to its enabled state. Similarly, a voltage at the NodeN while the differential tri-state circuit is in its disabled state is approximately the same as that at the NodeN when the tri-state circuit is switched to its enabled state (see the signals NodeP and NodeN in FIG. 3). Because no fluctuation occurs in the potentials of the NodeP and NodeN, there is neither transient drop in a gate voltage VGP of the transistor P1 due to parasitic capacity CP of the p-channel MOS FET nor transient rise in a gate voltage VGN of the transistor N1 due to parasitic capacity CN of the p-channel MOS FET. As a result, there is neither a swing in voltages occurring at the output terminal OUTB toward a positive direction nor a swing in voltages occurring simultaneously at the output terminal OUTA toward a negative direction (see the signals OUTA and OUTB in FIG. 3).

Thus, according to configurations of the differential tri-state of the present invention, there is almost no fluctuation in potentials of the NodeP and NodeN and no variation occurs in an amplitude of a voltage of output voltage signals, enabling the production of the output voltage signals being free from noise and preventing malfunctions of circuits to be connected to the differential tri-state circuit.

Second Embodiment

Figure 4:
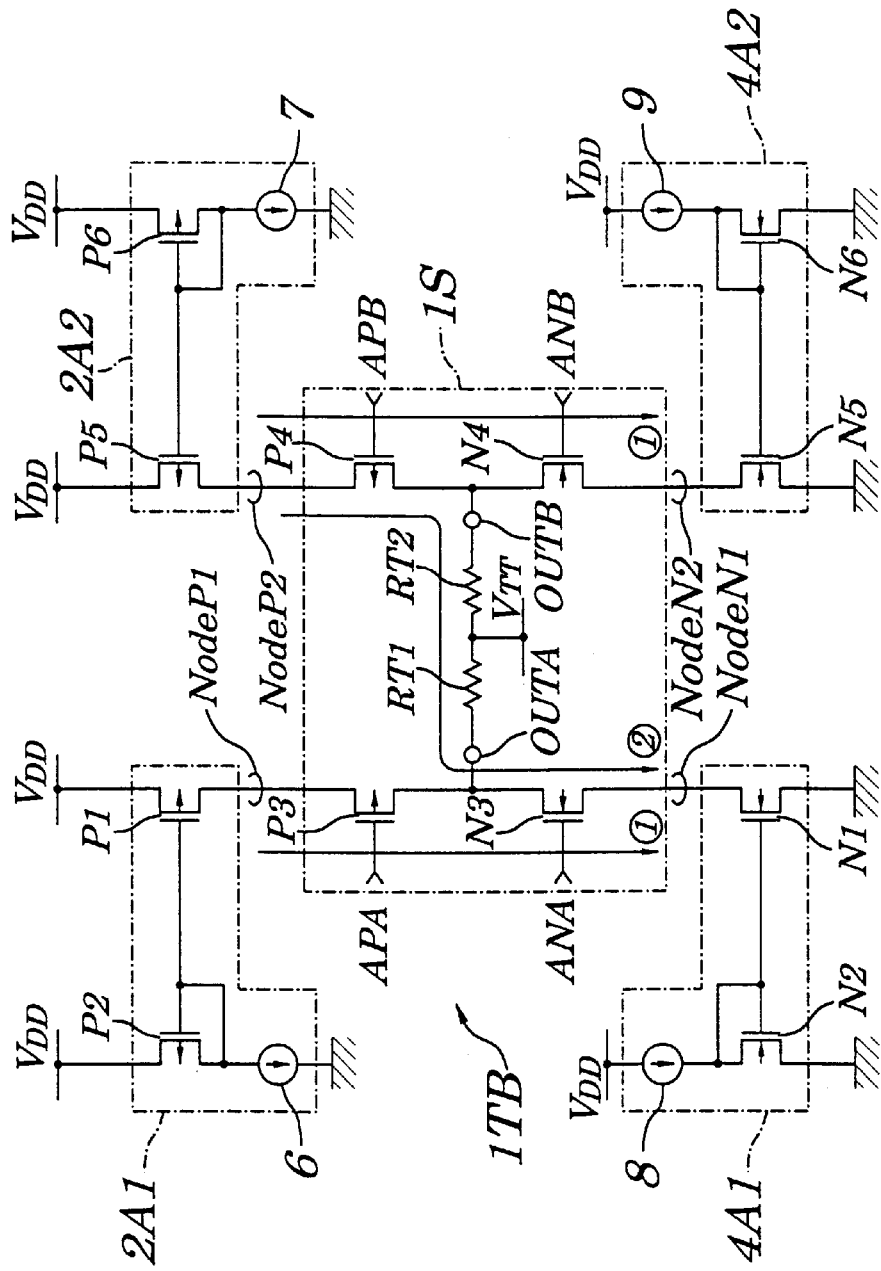
FIG. 4 is a schematic circuit diagram showing configurations of a differential tri-state circuit according to a second embodiment of the present invention.
Figure 5:
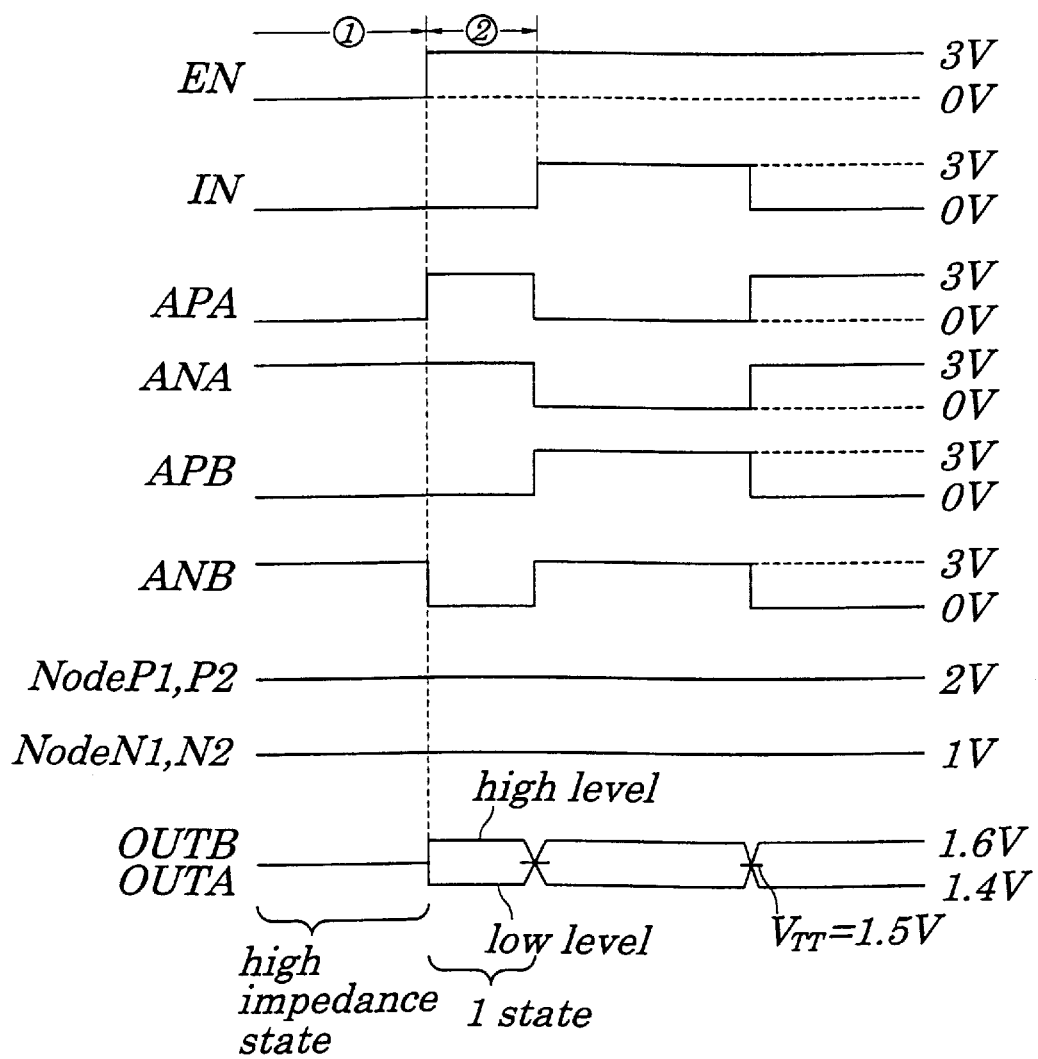
FIG. 5 is a timing chart showing operations of the differential tri-state circuit of the second embodiment of the present invention.

FIG. 4 is a schematic circuit diagram showing configurations of a differential tri-state circuit according to a second embodiment of the present invention. FIG. 5 is a timing chart showing operations of the differential tri-state circuit of the second embodiment of the present invention. The configurations of the differential tri-state circuit of this embodiment differ greatly from those of the first embodiment in that each of current sources 2A1 and 2A2 is connected to each of p-type MOS FETs P3 and P4 respectively and each of current sources 4A1 and 4A2 is connected to each of N-type MOS FETs N3 and N4 respectively.

The current source 2A1 is comprised of a p-channel MOS FET P1 a source of which is connected to a voltage source VDD having, for example, a predetermined voltage being 3 volts and a drain of which is connected to a current flow-out terminal NodeP1, a p-channel MOS FET P2 a source of which is connected to the voltage source VDD, a gate of which is connected to a gate of the p-channel MOS FET P1 and the gate and a drain of which are connected to each other, and a current source 6 connected between the drain of the p-channel MOS FET P2 and a ground potential point. The current flow-out terminal NodeP1 of the current source 2A1 is connected to a source of a p-channel MOS FET P3.

The current source 2A2 is comprised of a p-channel MOS FET P5 a source of which is connected to a voltage source VDD having, for example, 3 volts and a drain of which is connected to a current flow-out terminal NodeP2, a p-channel MOS FET P6 a source of which is connected to a voltage source VDD, a gate of which is connected to a gate of the p-channel MOS FET P5 and the gate and a drain of which are connected to each other, and a current source 7 connected between the drain of the p-channel MOS FET P6 and a ground potential point. The current flow-out terminal NodeP2 of the current source 2A2 is connected to a source of a p-channel MOS FET P4.

The current source 4A1 is comprised of an n-channel MOS FET N1 a source of which is connected to a predetermined voltage value point, for example, a ground potential point and a drain of which is connected to a current flow-out terminal NodeN1, an n-channel MOS FET N2 a source of which is connected to a ground potential point, a gate of which is connected to a gate of the n-channel MOS FET N1 and the gate and a drain of which are connected to each other and a current source 8 connected between a drain of the n-channel MOS FET N2 and a voltage source VDD. The inflow terminal NodeN1 of the current source 4A1 is connected to a source of an n-channel MOS FET N3.

The current source 4A2 is comprised of an n-channel MOS FET N5 a source of which is connected to a specified voltage point, for example, to a ground potential point and a drain of which is connected to a current flow-out terminal NodeN2, an n-channel MOS FET N6 a source of which is connected to a ground potential point and a gate of which is connected to a gate of the n-channel MOS FET N5 and the gate and a drain of which are connected to each other and a current source 9 connected between a drain of an n-channel MOS FET N6 and a constant voltage source VDD. The inflow terminal NodeN2 of the current source 9 is connected to a source of an n-channel MOS FET N4.

Except those described above, configurations of the differential tri-state circuit of this embodiment are the same as those of the first embodiment. The same reference numbers in FIG. 4 designate corresponding parts shown in FIG. 1 and their descriptions of the same parts are omitted accordingly. Also, a switching voltage generating circuit used to supply a switching voltage to the differential tri-state circuit of this embodiment has the same configurations as those shown in FIG. 2 and their descriptions of the same parts are omitted accordingly.

Next, operations of the differential tri-state circuit of this embodiment are hereafter described by referring to FIGS. 2, 4 and 5. When the differential tri-state circuit is in its disabled state (i.e., during a period ① of the signal EN in FIG. 5), that is, while an enable signal EN is at a low level, since, regardless of a level of an input signal IN, the switching voltage generating circuit 11, as in the case of the first embodiment, produces switching voltage signals APA, APB, ANA and ANB, and all of the p-type MOS FET P3, p-type MOS FET P4, n-type MOS FET N3 and n-type MOS FET N4 are put in a ON state, the current I flows through the p-type MOS FET P3, n-type MOS FET N3, p-type MOS FET P4 and n-type MOS FET N4. This causes both the output terminals OUTA and OUTB to be at the same potential (i.e., at the voltage Vtt of the terminating supply power source VS) and causing the differential tri-state circuit to be in a high impedance state. If, while the input signal IN remains at a low level, a transition of the enable signal EN to a high level takes place (i.e., during a period ② of the signal EN in FIG. 5), as in the case of the first embodiment, though the switching voltage signal APB generated by the switching voltage generating circuit 11 remains at a low level (see the signal APB in FIG. 5), the switching voltage signal ANA remains at a high level (see the signal ANA in FIG. 5), a level of the switching voltage signal APA becomes high (see the signal APA in FIG. 5) and a level of the switching voltage signal ANB becomes low (see the signal ANB in FIG. 5).

Then, since the switching voltage signal APB which remains at a low level is fed to the gate of the p-channel MOS FET P4 and the switching voltage signal ANA which remains at a high level is fed to the gate of the n-channel MOS FET N3, these transistors remain in an ON state. However, since the switching voltage signal APA a level of which has become high is fed to the gate of the p-channel MOS FET P3 and the switching voltage signal ANB a level of which has become low is fed to the gate of the n-channel MOS FET N4, these MOS FETs P3 and N4 are turned OFF. Accordingly, the current I flows from the current source 2A2 through the p-channel MOS FET P4 which has been turned ON, terminating resistors RT2 and RT1 and the n-channel MOS FET N3 which also has been turned ON to the current source 4A1. That is, a voltage signal, which is at a high level at the output terminal OUTB and at a low level at the output terminal OUTA, is generated between the terminating resistors RT2 and RT1. The high-level or low-level voltage generated at either of these two terminals may be defined logically as a 1 state and a 0 state or vice versa.

When the differential tri-state circuit is switched from its disabled state to its enabled state, since the same current I as flows during the period ① in the timing chart in FIG. 5 flows through the p-type MOS FET P4 and the n-type MOS FET N3, neither the potential of the NodeP2 nor of the NodeN1 fluctuates (see the signals NodeP2 and N1).

Since there is neither fluctuation in the potential of the NodeP2 nor of the NodeN1, no transient drop occurs in the gate voltage VGP of the p-channel MOS FET P5 caused by parasitic capacity CP of the same FET and no transient rise occurs in the gate voltage VGN of the n-channel MOS FET N1 caused by parasitic capacity CN of the same FET.

Therefore, when the differential tri-state circuit is switched from its disabled state to its enabled state, no increase occurs in the current flowing from the current source 2A2 through the p-channel MOS FET P4, terminating resistors RT2 and RT1 and the n-channel MOS FET N1 to the current source 4A1. As a result, there is neither a swing in voltages occurring at the output terminal OUTB toward a positive direction nor a swing in voltages occurring simultaneously at the output terminal OUTA toward a negative direction (see the signals OUTA and OUTB).

Thus, according to this embodiment, variations in amplitudes of voltage signals to be generated between the output terminals OUTB and OUTA can be eliminated, making it possible to produce an output voltage signal being free from noise and to prevent malfunctions of circuits to be connected to the differential tri-state circuit.

Third Embodiment

Figure 6:
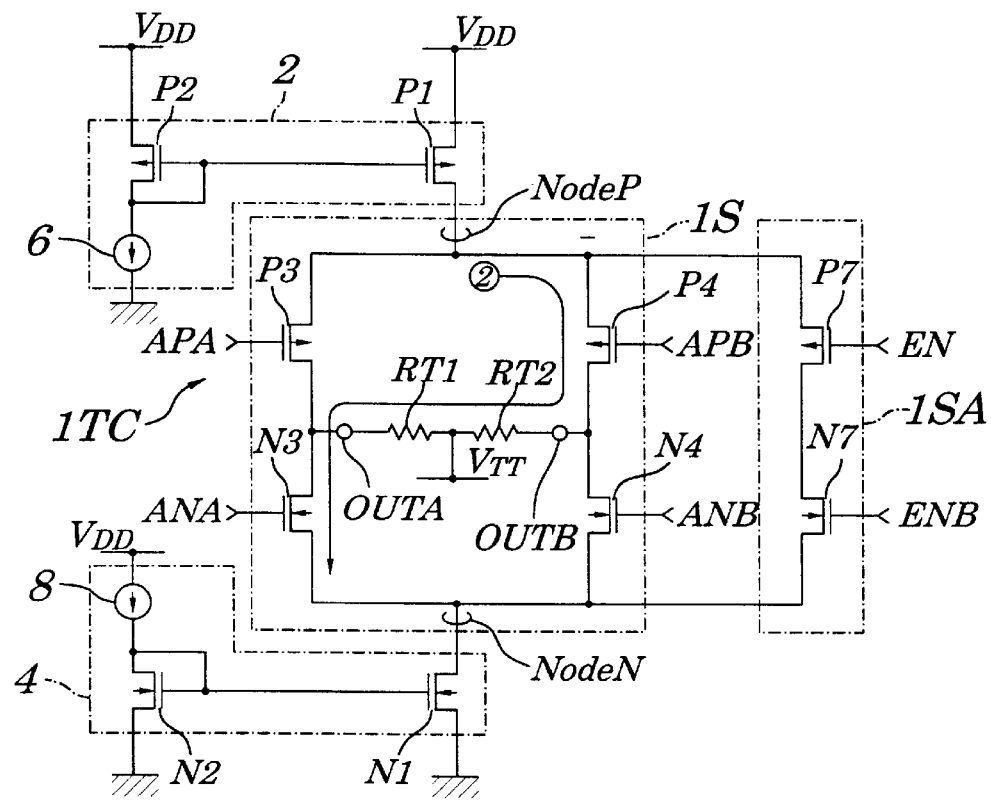
FIG. 6 is a schematic circuit diagram showing configurations of a differential tri-state circuit according to a third embodiment of the present invention.
Figure 7:
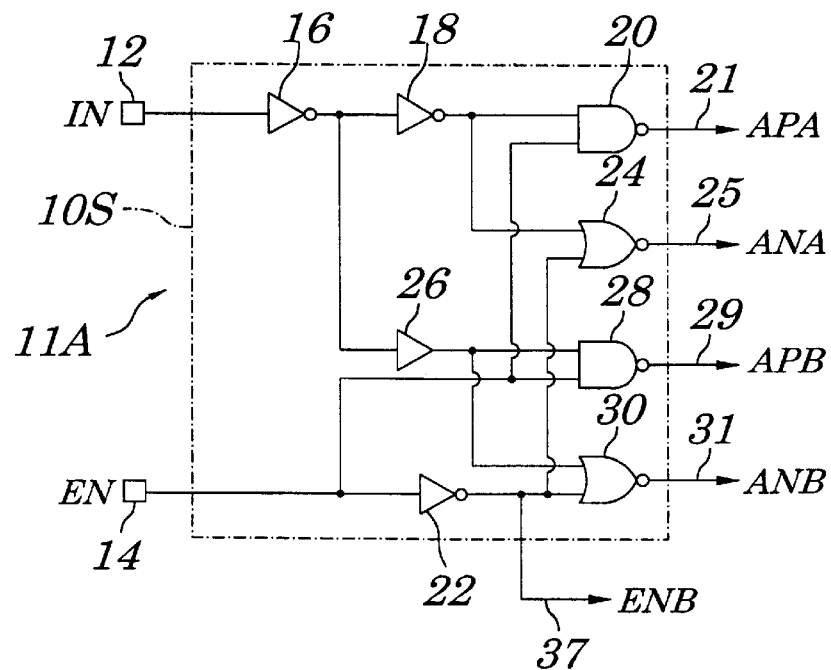
FIG. 7 is a schematic circuit diagram showing configurations of a switching voltage generating circuit of the differential tri-state circuit of the third embodiment.
Figure 8:
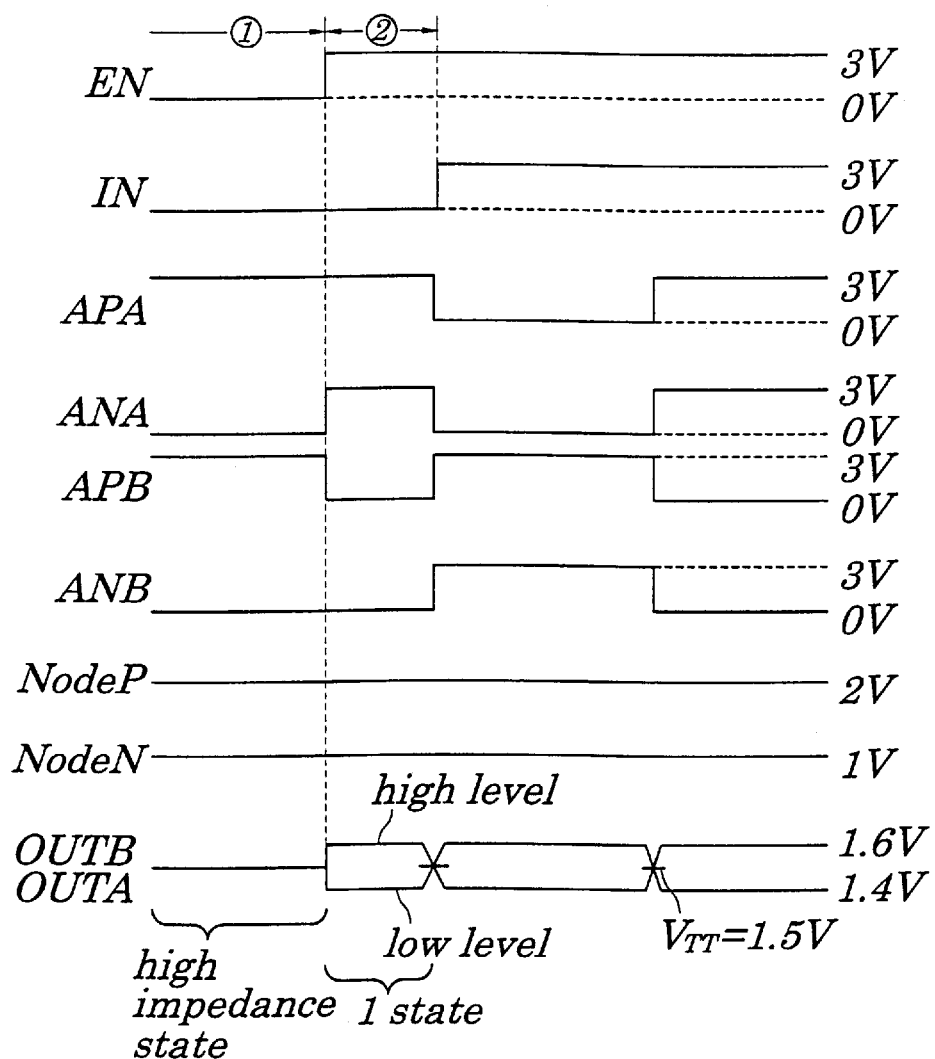
FIG. 8 is a timing chart showing operations of the differential tri-state circuit of the third embodiment of the present invention.

FIG. 6 is a schematic circuit diagram showing configurations of a differential tri-state circuit according to a third embodiment of the present invention. FIG. 7 is a schematic circuit diagram showing configurations of a switching voltage generating circuit of the differential tri-state circuit of the third embodiment. FIG. 8 is a timing chart showing operations of the differential tri-state circuit of the third embodiment of the present invention.

The configurations of the differential tri-state circuit of the third embodiment differ greatly from those of the first embodiment in that a transistor circuit 1SA is additionally provided in parallel to a switching circuit 1S, which is used to turn OFF all switching transistors of the switching circuit 1S and to cause a current that flows while the switching circuit 1S is in an enabled state to bypass the switching circuit 1S while it is in an disabled state. The transistor circuit 1SA is comprised of a p-channel MOS FET P7 and an n-channel MOS FET N7 a drain of which is connected to a drain of the p-channel MOS FET P7. A source of the p-channel MOS FET P7 is connected to a NodeP of the switching circuit 1S and a source of the n-channel MOS FET N7 is connected to a NodeN of the switching circuit 1S. A gate of the p-channel MOS FET P7 of the transistor circuit 1SA is connected to an input terminal 12 of an enable signal EN shown in FIG. 7. An output terminal 37 of an inverter 22 of a switching voltage generating circuit 11A shown in FIG. 7 is connected to the gate of the n-channel MOS FET N7. These transistor circuit 1SA and the switching voltage generating circuit 11A constitute the differential tri-state circuit 1TC of the third embodiment.

A p-channel MOS FET P3, n-channel MOS FET N4, p-channel MOS FET P4, n-channel MOS FET N3, p-channel MOS FET P7 and n-channel MOS FET N7 are mounted on the same board and each of their gate channel lengths and their gate channel widths is set to be the same to make all resistance values equal when they are conducting. Moreover, in this embodiment, resistances of the resistors RT1 and RT2 are treated as negligible values, however, it is possible to set the resistance, into which resistance values of the resistors RT1 and RT2 are taken into consideration, to a desired resistance in a conduction state of the tri-state circuit. This can be easily realized by adjusting the gate channel width and gate channel length of the p-channel MOS FET P7 and n-channel MOS FET N7.

Figure 10:
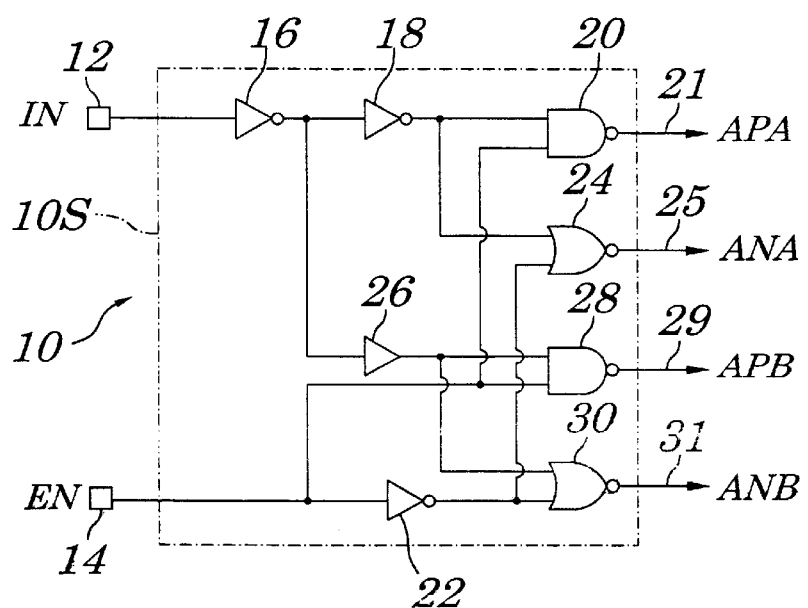
FIG. 10 is a schematic diagram showing a switching voltage generating circuit of the conventional differential tri-state circuit.
Figure 11:
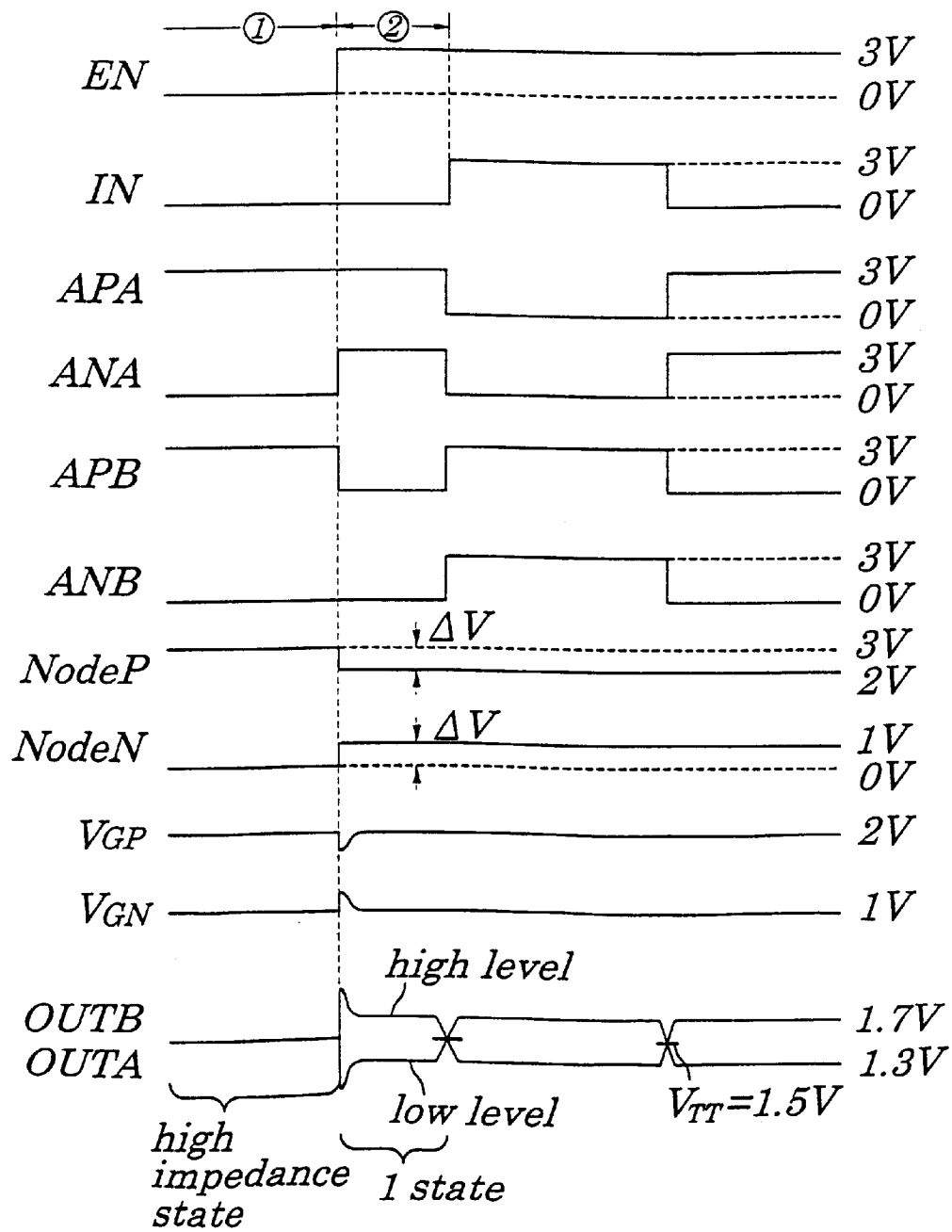
FIG. 11 is a timing chart showing operations of the conventional differential tri-state circuit.
Figure 12:
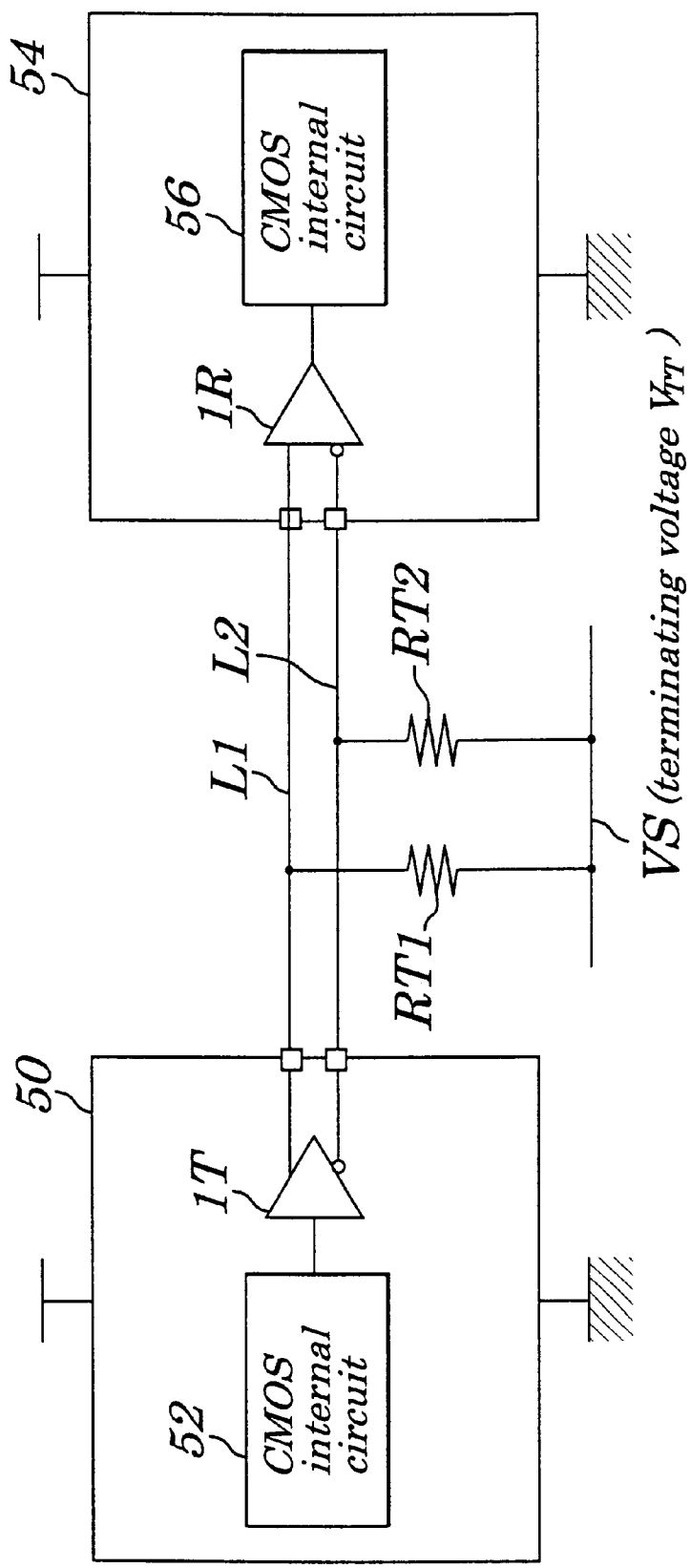
FIG. 12 is a schematic diagram showing a conventional small-amplitude interfacing output circuit.

Except those described above, configurations of this embodiment are the same as the switching circuit 1S of the differential tri-state circuit of the first embodiment and the switching voltage generating circuit shown in FIG. 10. The same reference numbers in FIGS. 6 and 7 designate corresponding parts shown in FIGS. 1 and 10 and their descriptions of the same parts are omitted accordingly.

Next, operations of the differential tri-state circuit of the third embodiment are described by referring to FIGS. 6 to 8.

In a state where a low-level enable signal EN is fed to an enable terminal 14 of the switching voltage generating circuit 11A (i.e., during a period ① of the signal EN in FIG. 8), regardless of a voltage level of an input signal IN fed to an input terminal 12, as in the case of the conventional circuit, since each of a switching voltage signal APA being at a high level and switching voltage signal APB (see the signals APA and APB) is supplied to each gate of the p-channel MOS FETs P3 and P4 and each of a switching voltage signal ANA and switching voltage signal ANB (see the signals ANA and ANB) is supplied to each gate of the n-channel MOS FETs N3 and N4, all the MOS FETs of the switching circuit are turned OFF and any current does not flow from the current source 2 to the current source 4 through any current path, causing the output terminals OUTA and OUTB to have a voltage value VTT of a terminating power supply source VS (see the signals OUTA and OUTB in FIG. 8) and the differential tri-state circuit to be put in a high impedance state accordingly. At this point, a voltage of the NodeP is VDD−ΔV=3−1=2 volts while a voltage of the NodeN is a ground potential+ΔV=0+1=1 volt.

Then, since a low-level enable signal EN is fed to the gate of the p-channel MOS FET P7 and a low-level switching voltage signal ENB is fed to the gate of the n-channel MOS FET N7, these FETs P7 and N7 are turned ON. Accordingly, the current I flows through the p-channel MOS FET P7 being in an ON state and the n-channel MOS FET N7 to the current source 4.

In a state where the input signal IN remains at a low level (during a period ② in FIG. 8), when the differential tri-state circuit is switched from its disabled state to its enabled state, for example, if a high-level enable signal EN is inputted (i.e., during the period ② in FIG. 8), as in the case of the conventional circuit, a level of the switching voltage signal APB generated by the switching voltage signal generating circuit 10 becomes low and a level of the switching voltage signal ANA becomes high. At this point, the switching voltage signal APA remains at a high level and the switching voltage signal ANB remains at a low level. Then, a low-level switching voltage signal ENB is generated by an inverter 22 of the switching voltage generating circuit 11A. Since each of the high-level switching voltage signal APA and low-level switching voltage signal ANB continues to be supplied to each gate of the p-channel MOS FET P3 and n-channel MOS FET N4 in the same manner as while the differential tri-state circuit is in the disabled state, these FETs P3 and N4 remain OFF. However, since a switching voltage signal APB a level of which has become low is fed to the gate of the p-channel MOS FET P4 and a switching voltage signal ANA a level of which has become high is fed to the gate of the n-channel MOS FET N3, these MOS FETs P4 and N3 are turned ON and, at the same time, the p-channel MOS FET P7 and the n-channel MOS FET N7 are turned OFF.

Accordingly, the current I flows through the p-channel MOS FET P4 being turned ON, terminating resistors RT2 and RT1 and the n-channel MOS FET N3 to the current source 4. The current I, which had flown through the p-channel MOS FET P7 and n-channel MOS FET N7, flows through the p-channel MOS FET P4 being turned ON, terminating resistors RT2 and RT1 and the n-channel MOS FET. That is, a voltage signal which is at a high level at the output terminal OUTB and at a low level at the output terminal OUTA is produced between the terminating resistors RT2 and RT1. The high-level or low-level voltage generated at either of these two terminals may be defined logically as a 1 state and a 0 state or vice versa.

Since the resistance of terminating resistors RT1 and RT2 is so small that it can be neglected, unlike the resistance of the p-channel MOS FET P4 and the n-channel MOS FET N3, even when a flow of the current is switched in such a manner as described above, no fluctuation occurs in the potential of the flow-out terminal NodeP and the in-flow terminal NodeN.

Since no fluctuation occurs both in the potential of the NodeP nor of the NodeN, neither a transient drop in the gate voltage VGP of the p-channel MOS FET P5 caused by parasitic capacity of the same nor a transient rise in the gate voltage VGN of the n-channel MOS FET N1 caused by parasitic capacity CN of the same occurs.

Therefore, when the differential tri-state circuit is switched from its disabled state to its enabled state, no increase occurs in the current flowing from the current source 2 through the p-channel MOS FET P4, terminating resistors RT2 and RT1 and the n-channel MOS FET N3 to the current source 4. As a result, there is neither a swing in voltages occurring at the output terminal OUTA toward a positive direction nor a swing in voltages occurring simultaneously at the output terminal OUTB toward a negative direction.

Thus, according to configurations of this embodiment, no variation occurs in an amplitude of a voltage of output voltage signals, enabling the production of the output voltage signals being free from noise and preventing malfunctions of circuits to be connected to the differential tri-state circuit.

As described above, according to the configurations of the present invention, with a current applied to the switching circuit which outputs three states of signals, by causing a high impedance state to exist between output terminals of the switching circuit and by switching the current that had flown in the switching circuit, a first signal state or second signal state can be outputted between output terminals. Moreover, with no current applied to the switching circuit which outputs three states of signals, by causing the current to be applied to the switching circuit to bypass the switching circuit and high impedance to exist between terminals of the switching circuit and, while this high impedance state is being brought about, by flowing the current which had bypassed the switching circuit into the switching circuit, a first signal state or second signal state can be outputted between output terminals.

Since the differential tri-state circuit of the present invention is so configured that fluctuation in voltages of the flow-out terminal from the current source and the inflow terminal to the current source can be prevented, there is neither a swing in voltages occurring at one output terminal toward a positive direction nor a swing in voltages occurring simultaneously at the other output terminal toward a negative direction, thus making it possible to produce an output voltage signal being free from noise, preventing a departure from amplitude specifications and malfunctions in circuits to be connected to the differential tri-circuit.

It is apparent that the present invention is not limited to the above embodiments but may be changed and modified without departing from the scope and spirit of the invention. For example, the present invention can be carried out even if the method to switch the differential tri-state circuit from its disabled state to its enabled state is inverted, i.e., the p-channel MOS FET P3 and n-channel MOS FET N4 may be brought into conduction and the p-channel MOS FET P4 and n-channel MOS FET N3 may be brought out of conduction. In this case, a high-level voltage is produced at the output terminal OUTA and a low-level voltage is produced at the output terminal OUTB. The high-level or low-level voltage generated at either of these two terminals may be defined logically as a 1 state and a 0 state or vice versa as described above.

Moreover, the p-channel or n-channel MOS FETs used as the switching circuit may be replaced with the n-channel MOS FETs or p-channel MOS FET respectively. Also, in the embodiments, the p-channel MOS FET and n-channel MOS FET are used, however, instead of these, a depletion-type unipolar transistor may be employed. Furthermore, in the above embodiments, the unipolar transistor, however, a bipolar transistor may be also employed. It is however noted that any unipolar or bipolar transistor produced under the same manufacturing conditions but having a different dimension may be employed, but the relation between a resistance of each transistor and a current flowing through each transistor, while each transistor is turned ON simultaneously, should satisfy the conditions required for making equal the potentials of the output terminals OUTA and OUTB.

Finally, the present application claims the priority based on Japanese Patent Application No.Hei10-349204 filed on Dec. 8, 1998, which is herein incorporated by reference.

What is claimed is:

1. A method for controlling an interface output circuit, said interface output circuit operating in a disabled state and an enabled state, said method comprising the steps of:

utilizing a connection point between first and second transistors connected in series to each other as a first output terminal and a connection point between third and fourth transistors connected in series to each other as a second output terminal, wherein said first connection point is connected through resistors to said second connection point and said first and second transistors are connected in parallel to said third and fourth transistors;

connecting a first current source to said first and third transistors;

connecting a second current source to said second and fourth transistors;

connecting a terminating power supply source to a node between said resistors;

switching said first to fourth transistors simultaneously to ON during a disabled state of said interface output circuit, to thereby cause said first and second output terminals to be in a high impedance state; and switching said first and fourth transistors OFF when said interface output circuit is switched to said enabled state.

2. A method for controlling an interface output circuit, said interface output circuit operating in a disabled state and an enabled state, said method comprising the steps of:

utilizing a connection point between first and second transistors connected in series to each other as a first output terminal and a connection point between third and fourth transistors connected in series to each other as a second output terminal, wherein said first connection point is connected through resistors to said second connection point and said first and second transistors are connected in parallel to said third and fourth transistors;

connecting a first current source to said first and third transistors;

connecting a second current source to said second and fourth transistors;

connecting a terminating power supply source to a node between said resistors;

switching said first to fourth transistors simultaneously to ON during a disabled state of said interface output circuit, to thereby cause said first and second output terminals to be in a high impedance state;

switching said first and fourth transistors OFF when said interface output circuit is switched to said enabled state; and outputting, in response to an enable signal, first and second signal states corresponding to a signal level representing a binary signal from said first and second output terminals, by turning OFF said first and fourth transistors.

3. An interface output circuit, comprising:

a differential circuit which includes: (a) first and second transistors connected in series, (b) a first output terminal connected to a connection point between said first and second transistors, (c) third and fourth transistors connected in series, and (d) a second output terminal connected to a connection point between said third and fourth transistors, wherein said first connection point is connected through resistors to said second connection point and wherein said first and second transistors are connected in parallel to said third and fourth transistors a first current source connected to said first and third transistors;

a second current source connected to said second and fourth transistors;

a terminating power supply source connected to a node between said resistors; and a switching voltage generating circuit connected to said differential circuit, said switching circuit switching said first to fourth transistors simultaneously to ON during a disabled state of said interface output circuit, to thereby cause said first and second output terminals to be in a high impedance state, and said switching circuit switching said first and fourth transistors OFF when said interface output circuit is switched to said enabled state.

4. The interface output circuit according to claim 3, wherein said four transistors are unipolar transistors.

5. The interface output circuit according to claim 3, wherein said first and third transistors are p-channel transistors and said second and fourth transistors are n-channel transistors.

6. The differential tri-state circuit according to claim 3, wherein said switching voltage generating circuit is comprised of a NOR circuit to output a first switching voltage signal to a gate of said first unipolar transistor when an input signal and an inverted enable signal are inputted, a NAND circuit to output a second switching voltage signal to a gate of said second unipolar transistor when an input signal and an enable signal are inputted, a NOR circuit to output a third switching voltage signal to a gate of said third unipolar transistor when an inverted input signal and an inverted enable signal are inputted and a NAND circuit to output a fourth switching voltage signal to a gate of said fourth unipolar transistor.

7. A differential circuit comprising:

a switching circuit wherein one connection point between said first and second transistors connected in series to each other and the other connection point between said third and fourth transistors connected in series to each other, with resistors inserted between said two connection points, are used as output terminals, a first input terminal to which said binary signal is inputted;

a second input terminal to which binary-format enable and disable signals are inputted;

a switching voltage generating circuit connected to said first and second input terminals, used to generate a first switching voltage signal group to turn ON said first and fourth transistors and to turn OFF said second and third transistors in response to a signal level representing one of two values for said binary signal and an enable signal, a second switching voltage signal group to turn to turn ON said second and third transistors and to turn OFF said first and fourth transistors in response to a signal level representing the other of two values for said binary signal and a third switching voltage signal group to simultaneously turn ON said first to fourth transistors in response to a disable signal;

whereby a resistance value of each of said first to fourth transistors existing when said first to fourth transistors are simultaneously turned ON, a value of a current to be supplied to said first and second transistor and a value of a current to be supplied to said third and fourth transistors are set to a value which causes said first and second output terminal to be at the same potential when said first to fourth transistors are simultaneously turned ON and wherein a first signal state corresponding to a signal level representing one of two values for said binary signal is outputted when said first switching voltage signal group is generated, a second signal state corresponding to a signal level representing the other of tow values for said binary signal is outputted when said second switching voltage signal group is generated, and a high impedance state is outputted when said third switching voltage signal group is generated.

8. The differential circuit according to claim 7, wherein said four transistors are unipolar transistors.

9. The differential circuit according to claim 7, wherein a source of said first transistor is connected in series to a drain of said second transistor and a source of said third transistor is connected in series to a drain of said fourth transistor.

10. The differential circuit according to claim 7, wherein said first and third transistors are composed of p-channel transistors having the same configurations and said second and fourth transistors are composed of n-channel transistors having the same configurations.

11. The differential circuit according to claim 7, wherein a first constant current source is connected to said first p-channel transistor, a second constant current source is connected to said second n-channel transistor, a third constant current source is connected to said third p-channel transistor and a fourth constant current source is connected to said fourth n-channel transistor.

12. The differential circuit according to claim 7, wherein a first terminating resistor is connected in series to a second terminating resistor and a terminating power supply source is connected to a connection point between these terminating resistors.

13. The differential circuit according to claim 7, wherein said switching voltage generating circuit is comprised of aNOR circuit to output a first switching voltage signal to a gate of said first unipolar transistor when an input signal and an inverted enable signal are inputted, a NAND circuit to output a second switching voltage signal to a gate of said second unipolar transistor when an input signal and an enable signal are inputted, a NOR circuit to output a third switching voltage signal to a gate of said third unipolar transistor when an inverted input signal and an inverted enable signal are inputted and a NAND circuit to output a fourth switching voltage signal to a gate of said fourth unipolar transistor when an inverted input signal and an enable signal are inputted.

14. A differential circuit comprising:
   a switching circuit utilizing a connection point between first and second transistors connected in series to each other as a first output terminal and a connection point between third and fourth transistors connected in series to each other as a second output terminal wherein said first connection point is connected through resistors to said second connection point and said first and second transistors are connected in parallel to said third and fourth transistors;
   transistor circuits connected between one connection point connecting, in parallel, said first transistor and second transistor connected in series to each other to said third transistor and said fourth transistor connected in series to each other and the other connection point;
   a first input terminal to which said binary signal is inputted;
   a second input terminal to which binary-format enable and disable signals are inputted;
   a switching voltage generating circuit connected to said first and second input terminals, used to generate a first switching voltage signal group to turn ON said first and fourth transistors and to turn OFF said second and third transistors in response to a signal level representing one of two values for said binary signal and an enable signal, a second switching voltage signal group to turn to turn ON said second and third transistors and to turn OFF said first and fourth transistors in response to a signal level representing the other of two values for said binary signal and a third switching voltage signal group to simultaneously turn ON said first to fourth transistors in response to a disable signal;
   whereby a first signal state corresponding to a signal level representing one of two values for said binary signal is outputted when said first switching voltage signal group is generated, a second signal state corresponding to a signal level representing the other of two values for said binary signal is outputted when said second switching voltage signal group is generated, and a high impedance state is outputted when said third switching voltage signal group is generated.

15. The differential circuit according to claim 14, wherein said four transistors are unipolar transistors.

16. The differential circuit according to claim 14, wherein a source of said first transistor is connected in series to a drain of said second transistor and a source of said third transistor is connected in series to a drain of said fourth transistor.

17. The differential circuit according to claim 14, wherein said first and third transistors are composed of p-channel transistors having the same configurations and said second and fourth transistors are composed of n-channel transistors having the same configurations.

18. The differential circuit according to claim 14, wherein a first constant current source is connected to one connection point connecting, in parallel, said first p-channel transistor and second n-channel transistor connected in series to each other to said third P-channel transistor and fourth n-channel transistor connected in series to each other, and a second constant current source is connected to the other connection point connecting in parallel, said first p-channel transistor and said second n-channel transistor connected in series to each other to said third p-channel transistor and said fourth n-channel transistor connected in series to each other.

19. The differential circuit according to claim 14, wherein a first terminating resistor is connected in series to a second terminating resistor and a terminating power supply source is connected to a connection point between these terminating resistors.

20. The differential circuit according to claim 14, wherein said switching voltage generating circuit is comprised of a NAND circuit to output a first switching voltage signal to a gate of said first unipolar transistor when an input signal and an enable signal are inputted, a NOR circuit to output a second switching voltage signal to a gate of said second unipolar transistor when an input signal and an inverted enable signal are inputted, a NAND circuit to output a third switching voltage signal to a gate of said third unipolar transistor when an inverted input signal and an enable signal are inputted and a NOR circuit to output a fourth switching voltage signal to a gate of said fourth unipolar transistor when an inverted input signal and an inverted enable signal.

21. An interface output circuit, comprising:
   a differential circuit which includes: (a) first and second transistors connected in series, (b) a first output terminal connected to a connection point between said first and second transistors, (c) third and fourth transistors connected in series, and (d) a second output terminal connected to a connection point between said third and fourth transistors, wherein said first connection point is connected through resistors to said second connection point and wherein said first and second transistors are connected in parallel to said third and fourth transistors;

a plurality of current sources to said first through fourth transistors;

a terminating power supply source connected to a node between said resistors; and a switching voltage generating circuit connected to said differential circuit, said switching circuit switching at least one of said first to fourth transistors to ON during a disabled state of said interface output circuit, and said switching circuit switching said first and fourth transistors OFF and said second and third transistors to ON when said interface output circuit is switched to said enabled state.

22. The interface output circuit according to claim 21, wherein said current sources includes:

a first current source connected to said first transistor;

a second current source connected to said second transistor;

a third current source connected to said third transistor; and a fourth current source connected to said fourth transistor.

23. A method for controlling an interface output circuit, said interface output circuit operating in a disabled state and an enabled state, said method comprising the steps of:

providing a connection point between first and second transistors connected in series as a first output terminal and a connection point between third and fourth transistors connected in series as a second output terminal, said first connection point being connected through resistors to said second connection point, and said first and second transistors are connected in parallel to said third and fourth transistors;

connecting current sources to said first through fourth transistors;

connecting a terminating power supply source to a node between said resistors;

switching at least one of said first to fourth transistors to ON during a disabled state of said interface output circuit, and switching said first and fourth transistors OFF and said second and third transistors ON when said interface output circuit is switched to said enabled state.

* * * * *